(12) United States Patent
Matsui (10) Patent No.: US 6,647,521 B2
(45) Date of Patent: *Nov. 11, 2003

(54) MEMORY TESTING METHOD AND APPARATUS, AND COMPUTER-READABLE RECORDING MEDIUM

(75) Inventor: Noriyuki Matsui, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,554

(22) Filed: Feb. 10, 1999

(65) Prior Publication Data

US 2002/0178412 A1 Nov. 28, 2002

(30) Foreign Application Priority Data

Jul. 1, 1998 (JP) ............................................ 10-186345

(51) Int. Cl.[7] ............................................. G11C 29/00
(52) U.S. Cl. ...................................... 714/719; 714/720
(58) Field of Search ................................ 714/718, 719, 714/720, 711, 6, 710, 8, 42, 721, 736, 733, 763, 732; 365/201, 200, 189.04, 189.07, 193, 220, 221; 711/129, 141; 324/73.1

(56) References Cited

U.S. PATENT DOCUMENTS

| | | | | |
|---|---|---|---|---|
| 4,414,665 A | * | 11/1983 | Kimura et al. ............... 714/719 |
| 4,601,034 A | * | 7/1986 | Sridhar ........................ 714/732 |
| 4,872,168 A | * | 10/1989 | Aadsen et al. ............... 714/720 |
| 5,053,698 A | * | 10/1991 | Ueda ........................... 714/736 |
| 5,379,394 A | * | 1/1995 | Goto ........................... 710/126 |
| 5,400,342 A | * | 3/1995 | Matsumura et al. ......... 714/719 |
| 5,479,413 A | * | 12/1995 | Sicola et al. ................. 714/718 |
| 5,481,671 A | * | 1/1996 | Fujisaki ........................... 714/8 |
| 5,577,050 A | * | 11/1996 | Bair et al. .................... 714/710 |
| 5,654,971 A | * | 8/1997 | Heitele et al. ............... 714/735 |
| 5,745,498 A | * | 4/1998 | Adams et al. ............... 714/718 |
| 5,835,704 A | * | 11/1998 | Li et al. ......................... 714/42 |
| 5,959,914 A | * | 9/1999 | Gates et al. ................. 365/201 |
| 6,065,141 A | * | 5/2000 | Kitagawa ..................... 714/711 |
| 6,073,085 A | * | 6/2000 | Wiley et al. ................. 702/118 |
| 6,161,204 A | * | 12/2000 | Gans ........................... 714/718 |

FOREIGN PATENT DOCUMENTS

JP 9-231743 9/1997 ......... G11C/11/401

OTHER PUBLICATIONS

Hawkins (Concepts of Digital Electronics; 1st Edition, 1983, pp. 31–37).*
Mazumder, P et al. (An efficient built–in self testing for random–access memory; IEEE, May 1989).*
Al–Assadi, W.K. et al. (A bipartite, differential I/sub DDQ/ testable static RAM design; IEEE, Aug. 7–8, 1995).*
NA82081216 : Testing of Memory Parts; IBM Technical Disclosure Bulletin, Aug. 1982, US; vol. 25, pp: 1216–1227.*
NN85046430 : Serial Data Channel Analysis System; IBM Technical Disclosure Bulletin, Apr. 1985, US; vol. 27, pp: 6430–6436.*
NN85091733(Self–Test/Connection Technique for Wafer Scale Integration Memory; IBM Technical Disclosure Bulletin, Sep. 1985, US; volume No.: 28, pages No.: 1733–1735,.*

* cited by examiner

Primary Examiner—Albert Decady
Assistant Examiner—Guy Lamarre
(74) Attorney, Agent, or Firm—Arent Fox Kintner Plotkin & Kahn, PLLC (57) ABSTRACT

A memory testing method tests a memory by writing test data to and reading test data from the memory. Data is successively read from the memory is synchronism with a clock and the data is compared. The memory testing method then judges a defect in the memory based on a result of the comparison.

15 Claims, 7 Drawing Sheets

MEMORY TESTING METHOD AND APPARATUS, AND COMPUTER-READABLE RECORDING MEDIUM

BACKGROUND OF THE INVENTION

1. Field of the Invention

The present invention generally relates to memory testing methods and apparatuses and computer-readable recording mediums, and more particularly to a memory testing method, a memory testing apparatus and a computer-readable recording medium for use in testing a clock synchronized type memory typified by a synchronous DRAM (SDRAM).

A memory testing apparatus is used to judge the existence of a defect in a memory, by writing test data to the memory and then reading the test data from the memory. Such a testing of the memory is carried out at a manufacturing stage of the memory, when shipping the memory, when delivering the memory to the user, or the like.

2. Description of the Related Art

Figure 1:
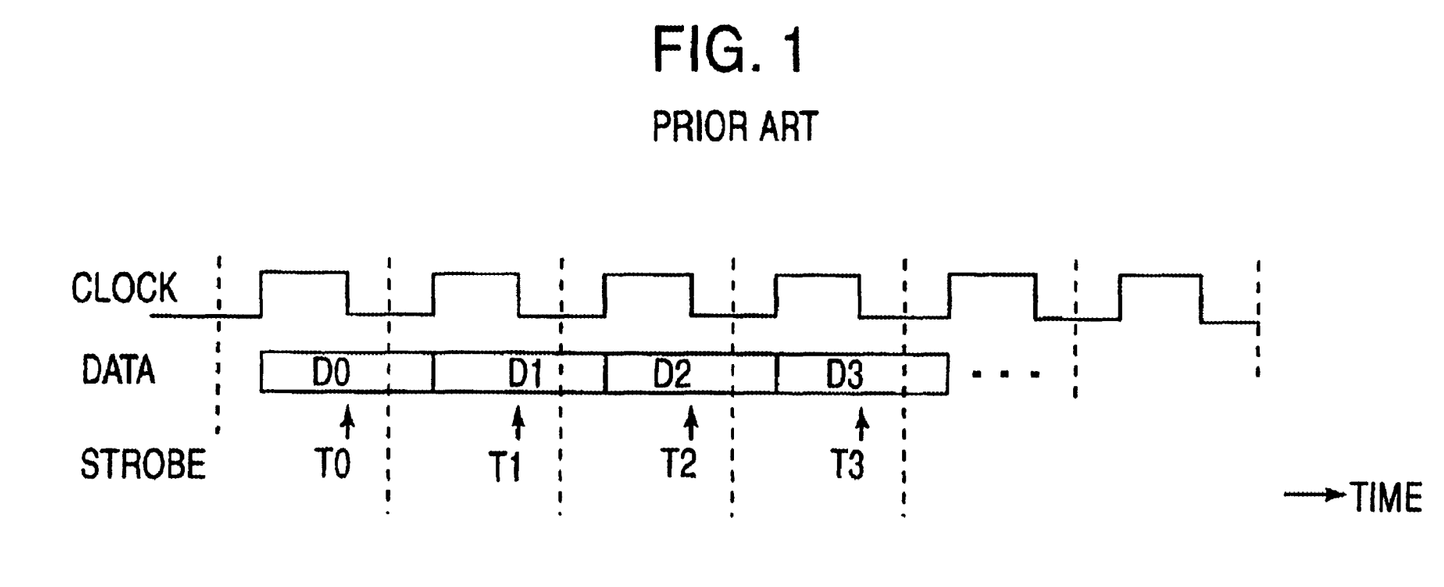
FIG. 1 is a time chart for explaining an example of a conventional method of testing a SDRAM.

FIG. 1 is a time chart for explaining an example of a conventional method of testing the SDRAM. As shown in FIG. 1, test data D0, D1, D2, . . . written in the SDRAM are successively read from corresponding addresses in synchronism with a rising edge of a clock. Anticipated values C0, C1, C2, . . . of the test data D0, D1, D2, . . . are prestored in a buffer or the like, and the test data D0, D1, D2, . . . actually read from the SDRAM and the corresponding anticipated values C0, C1, C2, . . . are compared with timings determined by strobe pulses T0, T1, T2, . . . . The timing of the strobe pulses T0, T1, T2, . . . is determined with reference to the rising edge or the falling edge of the clock.

For example, if the read test data D1 does not match the corresponding anticipated value A1 as a result of the comparison, it is judged that a defect exists in the SDRAM.

However, according to the conventional memory testing method, it is necessary to prestore the anticipated values C0, C1, C2, . . . corresponding to the test data D0, D1, D2, . . . in the buffer or the like. Hence, there are problems in that hardware such as a buffer having a relatively large storage capacity is required, thereby making the construction of the memory testing apparatus complex and expensive. In addition, since the anticipated values C0, C1, C2, . . . corresponding to each of the test data D0, D1, D2, . . . are read from the buffer or the like and compared with the corresponding test data D0, D1, D2, . . . , there is another problem in that there is a limit to increasing the testing speed.

On the other hand, in the memory testing apparatus which employs the conventional memory testing method described above, it is impossible to test a so-called double data rate (DDR) type memory which is constructed to successively read the data in synchronism with both the rising edge and the falling edge of the clock. For this reason, a high-speed memory testing apparatus exclusively for testing the DDR type memory is required to test the DDR type memory, and there is a problem in that a high-speed memory such as the DDR type memory cannot be tested at a high speed using the memory testing apparatus having the inexpensive construction.

SUMMARY OF THE INVENTION

Accordingly, it is a general object of the present invention to provide a novel and useful memory testing method and apparatus and a computer-readable recording medium, in which the problems described above are eliminated.

Another and more specific object of the present invention is to provide a memory testing method and apparatus and a computer-readable recording medium which enable testing of a memory at a high speed using a memory testing apparatus having a simple and inexpensive construction, and also enable testing of a high-speed memory such as the DDR type memory.

Still another object of the present invention is to provide a memory testing method for testing a memory by writing test data to and reading test data from the memory, comprising the steps of (a) out of data successively read from the memory in synchronism with a clock, comparing one of two data consecutively read from the memory as an anticipated data with another of the two data, and judging a defect in the memory based on a result of a comparison made in said step (b). According to the memory testing method of the present invention, it is possible to test at a high speed a memory using a memory testing apparatus having a simple and inexpensive construction, and a high-speed memory such as a DDR type memory can also be tested at a high speed.

A further object of the present invention is to provide a memory testing apparatus comprising writing and reading means for writing test data to and reading the test data from the memory, comparing means for comparing one of two data consecutively read from the memory as an anticipated data with another of the two data, out of data successively read from the memory by said writing and reading means in synchronism with a clock, and outputting a comparison result, and judging means for judging whether or not the memory is detective based on the comparison result obtained from said comparing means. According to the memory testing apparatus of the present invention, it is possible to test at a high speed a memory using a memory testing apparatus having a simple and inexpensive construction, and a high-speed memory such as a DDR type memory can also be tested at a high speed.

Another object of the present invention is to provide a computer-readable recording medium which stores a program for causing a computer to test a memory by writing test data to and reading the test data from the memory, comprising means for causing the computer to compare one of two data consecutively read from the memory as an anticipated data with another of the two data, out of data successively read from the memory in synchronism with a clock, and outputting a comparison result, and means for causing the computer to judge whether or not the memory is detective based on the comparison result. According to the computer-readable recording medium of the present invention, it is possible to test at a high speed a memory using an inexpensive general purpose computer, and a high-speed memory such as a DDR type memory can also be tested at a high speed.

Other objects and further features of the present invention will be apparent from the following detailed description when read in conjunction with the accompanying drawings.

DESCRIPTION OF THE PREFERRED EMBODIMENTS

Figure 2:
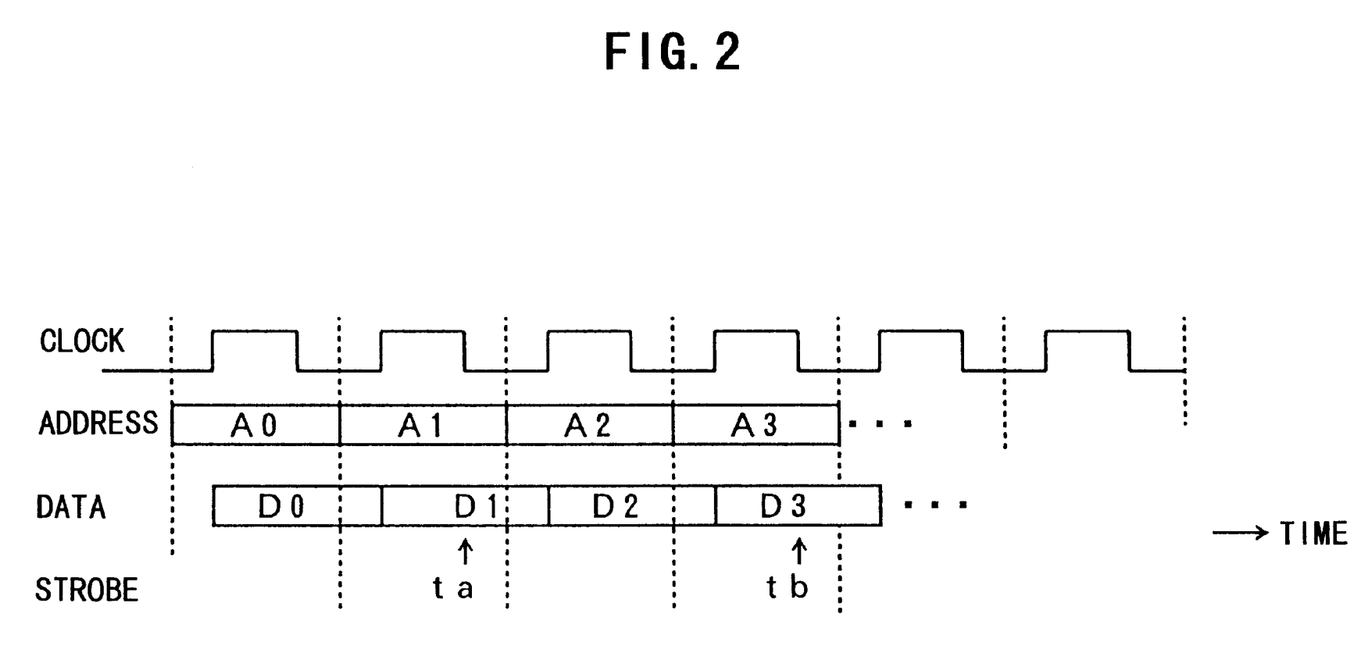
FIG. 2 is a time chart for explaining a first embodiment of a memory testing method according to the present invention.

FIG. 2 is a time chart for explaining a first embodiment of a memory testing method according to the present invention. In this first embodiment of the memory testing method, the present invention is applied to the testing of a SDRAM which is used as an example of a synchronous type memory.

As shown in FIG. 2, test data D0, D1, D2, ... written in the SDRAM are successively read from corresponding addresses A0, A1, A2, ... in synchronism with a rising edge of a clock. The test data D0 and D1, the test data D2 and D3, ... actually read from the SDRAM are compared at timings determined by strobe pulses ta, tb, .... The timings of the strobe pulses ta, tb, ... are determined with reference to a rising edge or a falling edge of the clock.

In a case where the test data D0, D1, D2, ... are formed by a stripe pattern or a checker-board pattern in which a data "0" and a data "1" alternately exist for every address, if the test data D0 is "0", for example, the test data D1, D2 and D3 respectively are "1", "0" and "1". For example, if the test data D0 and D1 compared at the timing of the strobe pulse ta match as a result of the comparison, it is judged that a defect exists in the SDRAM.

On the other hand, in a case where the test data D0, D1, D2, ... are formed by a pattern consisting solely of the data "0", if the test data D0 is "0", for example, the test data D1, D2 and D3 are all "0". For example, if the test data D0 and D1 compared at the timing of the strobe pulse ta do not match as a result of the comparison, it is judged that a defect exists in the SDRAM.

Similarly, in a case where the test data D0, D1, D2, ... are formed by a pattern consisting solely of the data "1", if the test data D0 is "1", for example, the test data D1, D2 and D3 are all "1". For example, if the test data D0 and D1 compared at the timing of the strobe pulse ta do not match as a result of the comparison, it is judged that a defect exists in the SDRAM.

A memory testing apparatus which is used to carry out this embodiment of the memory testing method can be realized by simply modifying only a part of the conventional memory testing apparatus. More particularly, it is unnecessary to provide a buffer or the like to prestore anticipated values, and the SDRAM can be tested by simply modifying the data to be compared with the test data and the test data comparing timing, that is, by merely modifying the timing of the strobe pulse.

Figure 3:
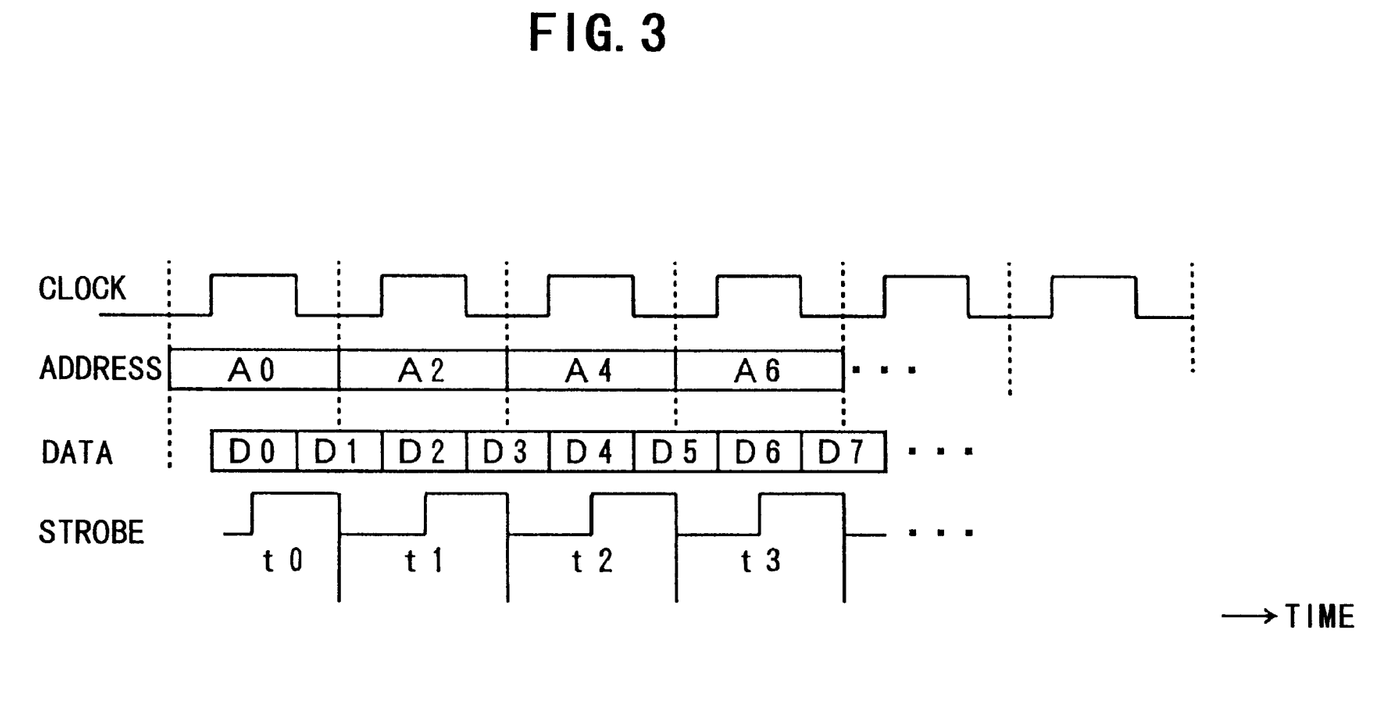
FIG. 3 is a time chart for explaining a second embodiment of the memory testing method according to the present invention.

FIG. 3 is a time chart for explaining a second embodiment of the memory testing method according to the present invention. In this second embodiment of the memory testing method, the present invention is applied to the testing of the DDR type SDRAM which is used as an example of the synchronous type memory.

As shown in FIG. 3, test data D0, D1, D2, ... written in the SDRAM are successively read from corresponding addresses A0, A2, A4, ... in synchronism with a rising edge of a clock. In a SRAM, the address is read at the rising edge of the clock, and the data corresponding to a number of consecutive addresses set by an initial setting from this read address are successively read at the rising and falling edges of the clock. In this embodiment, the address is read at the rising edge of the clock, and the data corresponding to two consecutive addresses from this read address are successively read. The test data D0 and D1, the test data D2 and D3, ... actually read from the SDRAM are compared at timings determined by strobe pulses t0, t1, .... The timings of the strobe pulses t0, t1, ... are determined with reference to the rising edge or the falling edge of the clock.

In a case where the test data D0, D1, D2, ... are formed by a stripe pattern or a checker-board pattern in which a data "0" and a data "1" alternately exist for every address, if the test data D0 is "0", for example, the test data D1, D2 and D3 respectively are "1", "0" and "1". For example, if the test data D0 and D1 compared during a high-level period of the strobe pulse to match as a result of the comparison, it is judged that a defect exists in the SDRAM.

On the other hand, in a case where the test data D0, D1, D2, ... are formed by a pattern consisting solely of the data "0", if the test data D0 is "0", for example, the test data D1, D2 and D3 are all "0". For example, if the test data D0 and D1 compared during a high-level period of the strobe pulse to do not match as a result of the comparison, it is judged that a defect exists in the SDRAM.

Similarly, in a case where the test data D0, D1, D2, ... are formed by a pattern consisting solely of the data "1", if the test data D0 is "1", for example, the test data D1, D2 and D3 are all "1". For example, if the test data D0 and D1 compared during a high-level period of the strobe pulse t0 do not match as a result of the comparison, it is judged that a defect exists in the SDRAM.

A memory testing apparatus which is used to carry out this embodiment of the memory testing method can be realized by simply modifying only a part of the memory testing apparatus used in the first embodiment of the memory testing method described above. More particularly, the DDR type SDRAM can be tested by simply modifying the timing of the strobe pulse. For this reason, this embodiment of the memory testing method can test the DDR type SRAM at a high speed, without the need to use a high-speed memory testing apparatus designed exclusively for the DDR type SRAM.

Figure 4:
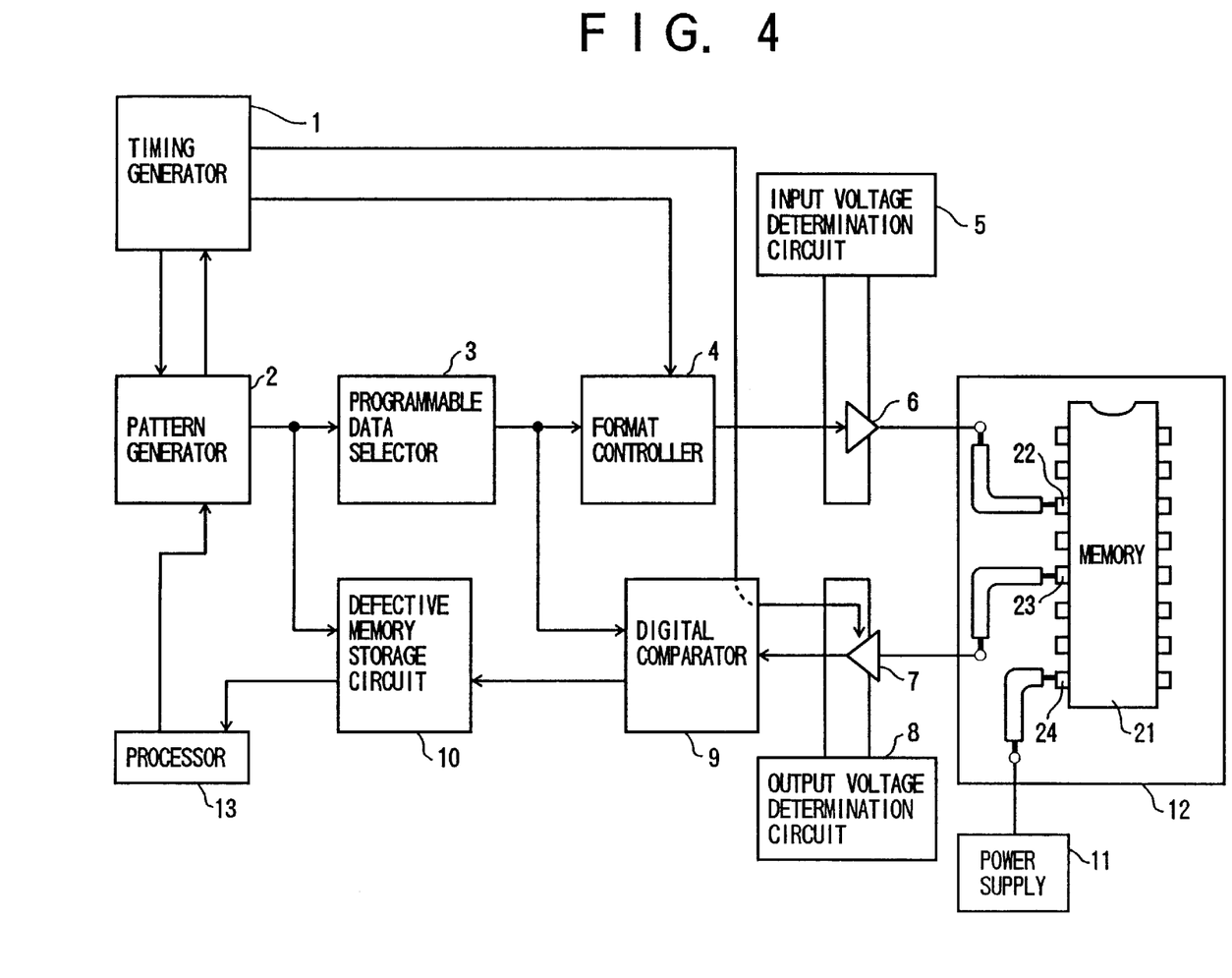
FIG. 4 is a system block diagram showing a first embodiment of a memory testing apparatus according to the present invention.

Next, a description will be given of a first embodiment of a memory testing apparatus according to the present invention. FIG. 4 is a system block diagram showing this first embodiment of the memory testing apparatus.

The memory testing apparatus shown in FIG. 4 generally includes a timing generator 1, a pattern generator 2, a programmable data selector 3, a format controller 4, an input voltage determination circuit 5, a driver 6, an analog comparator 7, an output voltage determination circuit 8, a digital comparator 9, a defective memory storage circuit 10, a voltage supply 11, a test board 12, and a processor 13.

A memory 21 which is to be tested is mounted on the test board 12, so that a pin 22 of the memory 21 is electrically connected to an output of the driver 6, a pin 23 of the memory 21 is electrically connected to an input of the analog comparator 7, and a pin 24 of the memory 21 is electrically connected to the power supply 11.

When writing the test data to the memory 21, the pattern generator 2 generates a test data waveform having a predetermined binary pattern, and outputs to the programmable data selector 3 and the defective memory storage circuit 10 the test data waveform corresponding to each address input from the processor 13 with a timing determined by the clock generated from the timing generator 1. Information indicating which pin of the memory 21 to be tested should be supplied with the test data is programmed beforehand in the programmable data selector 3. In this embodiment, it is determined from this information programmed in the programmable data selector 3 that the test data should be supplied to the pin 22, and the test data waveform is output to the format controller 4. The format controller 4 shapes the test data waveform. The shaped test data waveform is converted by the driver 6 into a voltage level determined by the input voltage determination circuit 5, and is supplied to the pin 22 as the test data.

In this embodiment, the programmable data selector 3 is programmed to supply the test data to the pin 22 of the memory 21. Hence, only a signal path to the pin 22 is shown in FIG. 4.

Signals such as the clock and address are supplied to the memory 21 by a known method. Hence, when writing the test data to the memory 21, the test data supplied to the pin 22 are successively written at specified addresses.

Thereafter, when reading the test data from the memory 21, signals such as the clock and address are supplied to the memory 21 by a known method. Thus, the test data written in the memory 21 are successively read from specified addresses. The read test data are output from the pin 23 and input to the analog comparator 7. In response to the strobe pulse generated from the timing generator 1, the analog comparator 7 converts the read test data into a voltage level determined by the output voltage determination circuit 8, and outputs the voltage to the digital comparator 9 and the processor 13.

When reading the test data from the memory 21, the digital comparator 9 compares the test data read from one of the two consecutive addresses as the anticipated value, with the test data read from the other of the two consecutive addresses, based on the addresses obtained from the pattern generator 2 via the programmable selector 3. In other words, the digital comparator 9 compares the two test data read from the two consecutive addresses. In addition, the digital comparator 9 compares the two test data read from the two consecutive addresses with a timing determined by the strobe pulse generated from the timing generator 1, and supplies a result of this comparison to the defective memory storage circuit 10.

In a case where the test data are formed by a stripe pattern or a checker-board pattern in which the data "0" and the data "1" alternately exist for every address, the test data read from two consecutive addresses will not match. Hence, in a case where the test data read from two consecutive addresses match as a result of a comparison made during a high-level period of the strobe pulse, for example, it is judged that a defect exists in the memory 21, and the digital comparator 9 supplies to the defective memory storage circuit 10 information indicating the existence of the defect in the memory 21.

On the other hand, in a case where the test data are formed by a pattern consisting solely of the data "0" or the data "1", the test data read from two consecutive addresses will match. Accordingly, in a case where the test data read from two consecutive addresses do not match as a result of a comparison made during a high-level period of the strobe pulse, for example, it is judged that a defect exists in the memory 21, and the digital comparator 9 supplied to the defective memory storage circuit 10 information indicating the existence of the defect in the memory 21.

The defective memory storage circuit 10 also receives from the pattern generator 2 information including the test data and the address from the pattern generator 2. Hence, based on the information received from the digital comparator 9, the defective memory storage circuit 10 stores a record, that is, a log, indicating the address of the memory 21 where a defect is generated and the test data which generated the defect when the test data are written to and then read from the memory 21.

After the operation of writing the test pattern to and then reading the test pattern from the memory 21 is carried out with respect to a last address specified from the processor 13, the processor 13 refers to the log stored in the defective memory storage circuit 10. Based on the log, the processor 13 carries out judgements including a judgement to determine whether or not the tested memory 21 is defective. If the test is carried out during the manufacturing stage of the memory 21, for example, the processor 13 judges whether or not a defect exists in the tested memory 21 based on the log. In this case, the processor 13 may judge that the tested memory 21 is defective if an amount of defect generated exceeds a predetermined amount, and carry out a redundancy process to provide redundancy for the defective addresses if the amount of defect generated is less than the predetermined amount.

Figure 5:
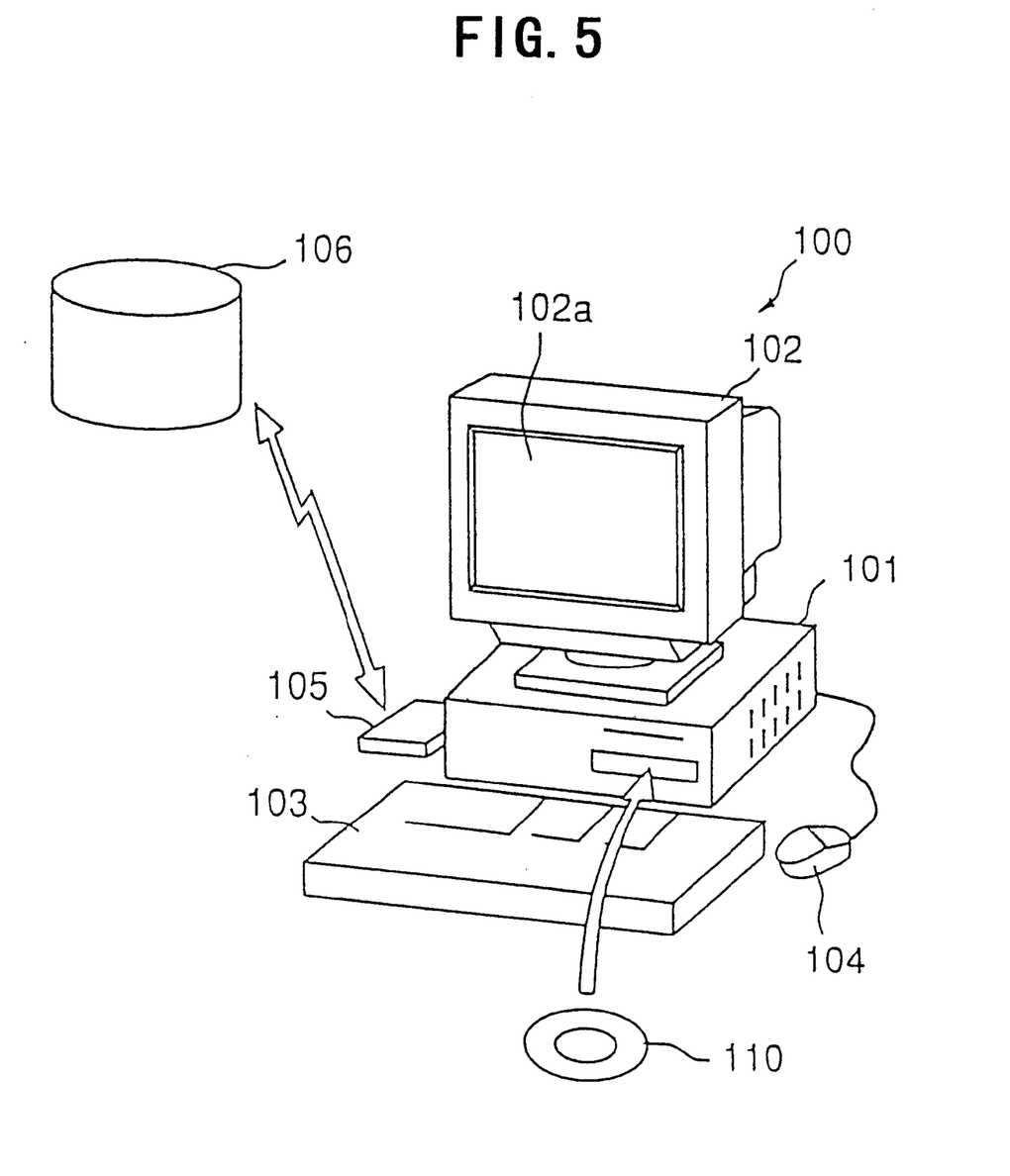
FIG. 5 is a perspective view showing a second embodiment of the memory testing apparatus according to the present invention.
Figure 6:
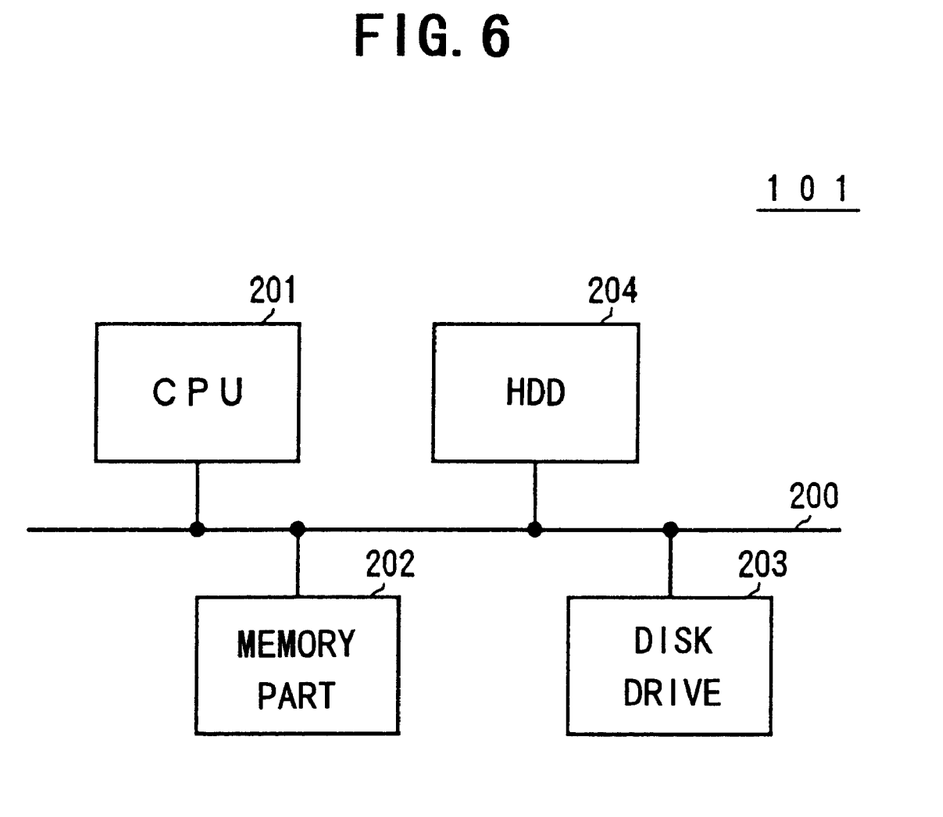
FIG. 6 is a system block diagram showing an important part of the second embodiment of the memory testing apparatus.

Next, a description will be given of a second embodiment of the memory testing apparatus according to the present invention. FIG. 5 is a perspective view showing the second embodiment of the memory testing apparatus, and FIG. 6 is a system block diagram showing an important part of the second embodiment of the memory testing apparatus. In this embodiment, a part of the memory testing apparatus shown in FIG. 4 excluding the power supply 11 and the test board 12 is realized by a general purpose computer system such as a personal computer. In FIGS. 5 and 6, the illustration of the power supply 11, the test board 12 and the memory 21 is omitted.

A computer system 100 shown in FIG. 5 generally includes a main body part 101 which includes a CPU, a disk drive and the like, a display 102 which displays an image on a display screen 102a in response to an instruction from the main body part 101, a keyboard 103 which is used to input various information to the computer system 100, a mouse 104 which is used to specify an arbitrary position on the display screen 102a of the display 102, and a modem 105 which makes access to an external database or the like and downloads a program or the like stored in another computer system. A program which is stored in a portable recording medium such as a disk 110 or, a program which is downloaded from a recording medium 106 of another computer system using a communication unit such as the modem 105, is input to the computer system 100 and compiled therein. This program includes a program which causes the CPU of the computer system 100 to carry out a memory testing operation according to the first or second embodiment of the memory testing method described above.

An embodiment of a computer-readable recording medium according to the present invention is formed by a recording medium such as the disk 110 which stores the program described above. Of course, the recording medium is not limited to portable or removable recording mediums such as an IC card memory, floppy disk, magneto-optical disk, CD-ROM and various semiconductor memory devices, and also includes recording mediums accessible by a computer system which is coupled via a communication means or a communication unit such as a LAN and modem.

FIG. 6 shows the construction of an important part within the main body part 101 of the computer system 100. In FIG. 6, the main body part 101 generally includes a CPU 201, a memory part 202 including memories such as a RAM and a ROM, a disk drive 203 for the disk 110, and a hard disk drive 204 which are coupled via a bus 200.

Of course, the construction of the computer system 100 is not limited to the construction shown in FIGS. 5 and 6, and various known computer constructions may be used in place of the above described construction.

Figure 7:
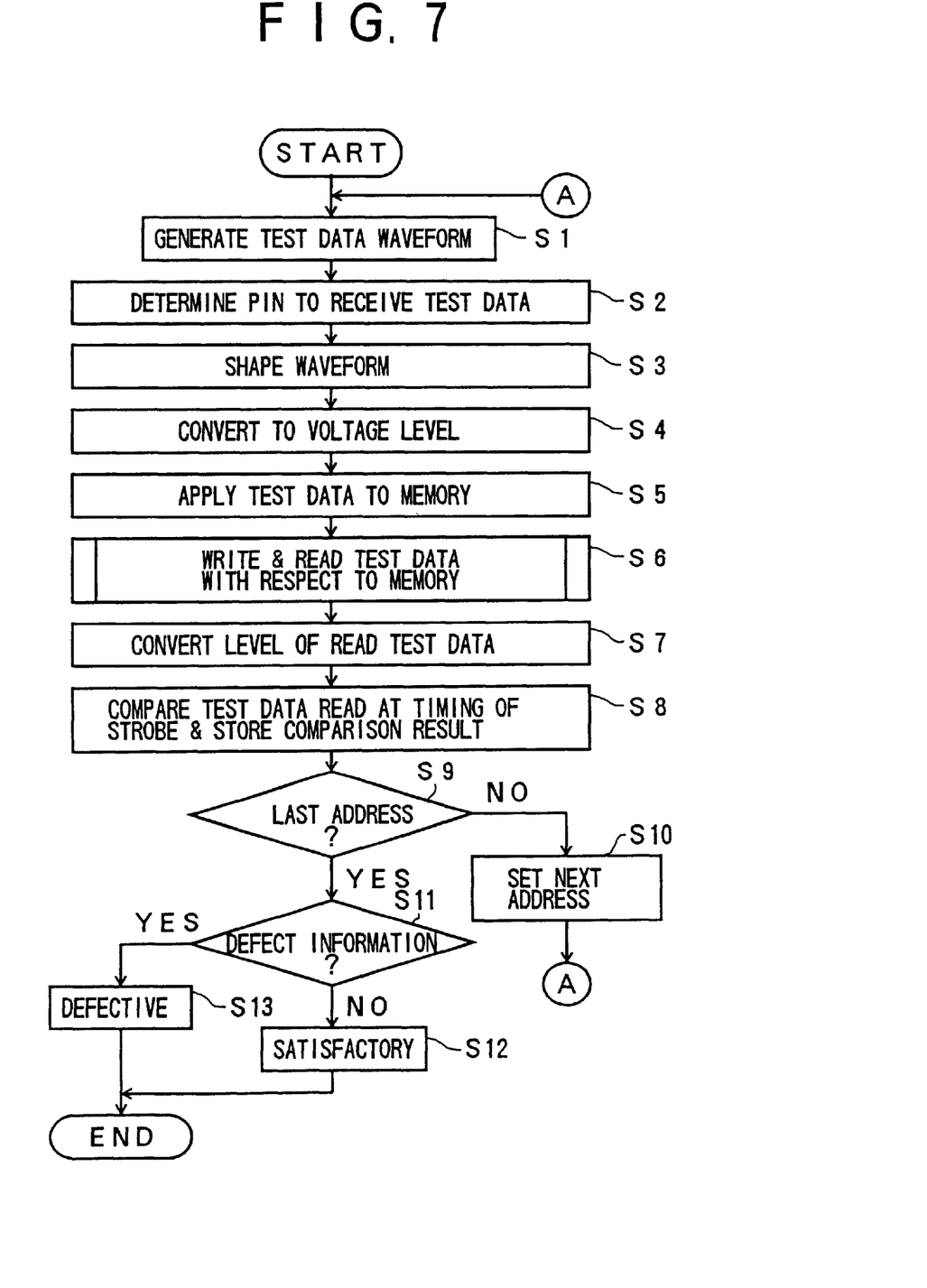
FIG. 7 is a flow chart for explaining a process carried out by a CPU in the second embodiment of the memory testing apparatus.

FIG. 7 is a flow chart for explaining a process carried out by the CPU 201 of this embodiment. In FIG. 7 a step S1 generates a test data waveform having a predetermined binary pattern stored in the memory part 202, for example, and outputs the test data waveform corresponding to each address at a timing determined by an internally generated clock. A step S2 determines a pin of the memory 21 to be supplied with the test data. In this embodiment, it is determined that the test data is to be supplied to the pin 22 of the memory 21. A step S3 shapes the test data waveform. A step S4 converts the shaped test data waveform into a predetermined voltage level, and a step S5 supplies the voltage to the pin 22 as the test data.

A step S6 supplies signals such as the clock and address to the memory 21 by a known method, and successively writes the test data supplied to the pin 22 at specified addresses. In addition, the step S6 thereafter supplies the signals such as the clock and the address to the memory 21 by a known method, and successively reads the written test data from the memory 21 from specified addresses. The test data read from the memory 21 are output from the pin 23.

A step S7 converts the read test data into a predetermined voltage level in response to an internally generated strobe pulse. Out of the test data read from two consecutive addresses, a step S8 compares the test data read from one address as an anticipated data with the test data read from the other address, based on the addresses, at a timing determined by the strobe pulse. Furthermore, the step S8 stores a result of this comparison in the memory part 202, for example.

In a case where the test data are formed by a stripe pattern or a checker-board pattern in which the data "0" and the data "1" alternately exist for every address, the test data read from two consecutive addresses will not match. For this reason, if the test data read from two consecutive addresses during a high-level period of the strobe pulse, for example, match, it is judged that a defect exists in the memory 21, and information indicating the existence of the defect in the memory 21 is stored in the memory part 202.

On the other hand, in a case where the test data are formed by a pattern consisting solely of the data "0" or the data "1", the test data read from two consecutive addresses will match. Hence, if the test data read from two consecutive addresses during a high-level period of the strobe pulse, for example, do not match, it is judged that a defect exists in the memory 21, and information indicating the existence of the defect in the memory 21 is stored in the memory part 202.

Therefore, the memory part 202 stores a record, that is, a log, indicating the address of the memory 21 where a defect is generated and the test data which generated the defect when the test data are written to and then read from the memory 21, based on the information related to the comparison result, the address and the test data.

A step S9 decides whether or not the operation of writing the test pattern to and reading the test pattern from the memory 21 is carried out with respect to the last address which is specified. If the decision result in the step S9 is NO, a step S10 sets a next address, and the process returns to the step S1. On the other hand, if the decision result in the step S9 is YES, a step S11 refers to the log stored in the memory part 202, and decides whether or not information related to the defect is stored in the log. If the decision result in the step S11 is NO, a step S12 judges that the tested memory 21 is satisfactory, that is, not defective, and the process ends. But if the decision result in the step S11 is YES, a step S13 judges that the tested memory 21 is not satisfactory, that is, defective, and the process ends.

In a case where the test is carried out during the manufacturing stage of the memory 21, the step S11 may decide whether or not defects exceeding a predetermined amount is generated in the tested memory 21. In this case, if the decision result in the step S11 is YES, the step S13 judges that the memory 21 is defective. On the other hand, if the decision result in the step S11 is NO, the step S12 carries out a redundancy process to provide redundancy for the defective addresses, and judges that the memory 21 is satisfactory.

Further, the present invention is not limited to these embodiments, but various variations and modifications may be made without departing from the scope of the present invention.

What is claimed is:

1. A method for testing a memory by writing test data to and reading the test data from the memory, comprising the steps of:
   (a) designating a predetermined sequence of a data of the test data for writing to the memory;
   (b) out of data successively read from the memory in synchronism with a clock, comparing pairs of data consecutively read from adjacent addresses of the memory as an anticipated data; and
   (c) judging a defect in the memory based on a result of a comparison made in step (b) in consideration of the predetermined sequence in step (a).

2. The memory testing method as claimed in claim 1, wherein the test data forms a pattern selected from a group of a checker-board pattern in which a data "0" and a data "1" alternately exist for every address, a stripe pattern in which the data "0" and the data "1" alternately exist for every address, a pattern made up solely of the data "0", and a pattern made up solely of the data "1".

3. The memory testing method as claimed in claim 2, wherein a read frequency of the data successively read from the memory in synchronism with the clock is two times a frequency of the clock.

4. The memory testing method as claimed in claim 1, wherein a read frequency of the data successively read from the memory in synchronism with the clock is two times a frequency of the clock.

5. A memory testing apparatus comprising:
   writing and reading means for writing a designated sequence of test data to and reading the test data from the memory;
   comparing means for comparing pairs of data consecutively read from adjacent addresses of the memory as an anticipated data, out of data successively read from the memory by said writing and reading means in synchronism with a clock, and outputting a comparison result; and
   judging means for judging whether or not the memory is defective based on the comparison result obtained from said comparing means and in consideration of the designated sequence of test data.

6. The memory testing apparatus as claimed in claim 5, wherein the test data forms a pattern selected from a group of a checker-board pattern in which a data "0" and a data "1" alternately exist for every address, a stripe pattern in which the data "0" and the data "1" alternately exist for every address, a pattern made up solely of the data "0", and a pattern made up solely of the data "1".

7. The memory testing apparatus as claimed in claim 6, wherein a read frequency of the data successively read from the memory by said writing and reading means in synchronism with the clock is two times a frequency of the clock.

8. The memory testing apparatus as claimed in claim 5, wherein a read frequency of the data successively read from the memory by said writing and reading means in synchronism with the clock is two times a frequency of the clock.

9. A computer-readable recording medium which stores a program for causing a computer to test a memory by writing a designated sequence of test data to and reading test data from the memory, said computer-readable recording medium comprising:

means for causing the computer to compare pairs of data consecutively read from adjacent addresses of the memory as an anticipated data, out of data successively read from the memory in synchronism with a clock, and outputting a comparison result; and means for causing the computer to judge whether or not the memory is defective based on the comparison result and in consideration of the designated sequence of test data.

10. The computer-readable recording medium as claimed in claim 9, wherein the test data forms a pattern selected from a group of a checker-board pattern in which a data "0" and a data "1" alternately exist for every address, a stripe pattern in which the data "0" and the data "1" alternately exist for every address, a pattern made up solely of the data "0", and a pattern made up solely of the data "1".

11. The computer-readable recording medium as claimed in claim 10, which further comprises:

means for causing the computer to successively read the data from the memory in synchronism with the clock at a read frequency which is two times a frequency of the clock.

12. The computer-readable recording medium as claimed in claim 9, which further comprises:

means for causing the computer to successively read the data from the memory in synchronism with the clock at a read frequency which is two times a frequency of the clock.

13. A memory testing method for testing a memory by writing test data to and reading the test data from the memory, comprising:

successively reading data from the memory in synchronism with a clock;

making a comparison by comparing two data which are consecutively read from the memory by using one of the two data as an anticipated data; and judging a defect in the memory based on a result of the comparison.

14. A memory testing apparatus comprising:

a writing and reading section writing test data to and reading the test data from the memory;

a comparing section comparing two data which are consecutively read from the memory by said writing and reading section, using one of the two data as an anticipated data; and (a) designating a predetermined sequence of a data of the test data for writing to the memory;

(b) out of data successively read from the memory in synchronism with a clock, comparing pairs of data consecutively read from adjacent addresses of the memory as an anticipated data; and (c) judging a defect in the memory based on a result of a comparison made in said step (b) in consideration of the predetermined sequence in step (a).

15. A computer-readable recording medium which stores a program for causing a computer to test a memory by writing test data to and reading the test data from the memory, said program comprising:

a procedure which causes the computer to successively read data from the memory in synchronism with a clock;

a procedure which causes the computer to make a comparison by comparing two data which are consecutively read from the memory by using one of the two data as an anticipated data; and a procedure which causes the computer to judge a defect in the memory based on a result of the comparison.

* * * * *